United States Patent
Park et al.

(10) Patent No.: US 9,887,376 B2
(45) Date of Patent: Feb. 6, 2018

(54) ORGANIC LIGHT EMITTING DEVICE AND LIGHTING APPARATUS COMPRISING THE SAME

(71) Applicant: LG DISPLAY CO., LTD., Seoul (KR)

(72) Inventors: Min Choon Park, Daejeon (KR); Jaein Lee, Daejeon (KR); Jeamin Moon, Daejeon (KR); Jina You, Daejeon (KR); Ok Geun Kim, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/110,550

(22) PCT Filed: Jan. 9, 2015

(86) PCT No.: PCT/KR2015/000251
§ 371 (c)(1),
(2) Date: Jul. 8, 2016

(87) PCT Pub. No.: WO2015/105381
PCT Pub. Date: Jul. 16, 2015

(65) Prior Publication Data
US 2016/0329514 A1    Nov. 10, 2016

(30) Foreign Application Priority Data
Jan. 10, 2014 (KR) ................ 10-2014-0003503

(51) Int. Cl.
*H01L 51/50* (2006.01)

(52) U.S. Cl.
CPC ...... *H01L 51/5036* (2013.01); *H01L 51/5016* (2013.01); *H01L 51/5024* (2013.01); *H01L 2251/5361* (2013.01)

(58) Field of Classification Search
CPC . H01L 51/50; H01L 51/5036; H01L 51/5016; H01L 51/5024
See application file for complete search history.

(56) References Cited

U.S. PATENT DOCUMENTS 5,834,130 A    11/1998    Kido
7,662,485 B2    2/2010    Begley et al.
(Continued)

FOREIGN PATENT DOCUMENTS

CN    1340590 A    3/2002
CN    1769370 A    5/2006
(Continued)

OTHER PUBLICATIONS

Lin, H.-P, et al., "A simple method of fabricating efficient blue organic light-emitting diodes based on a double-dopant and a double-emissive layer with an effective hole-trapping architecture," Journal of Optoelectronics and Advanced Materials, vol. 12, No. 12, Dec. 2010, pp. 2355-2362.
(Continued)

*Primary Examiner* — Phuc Dang
(74) *Attorney, Agent, or Firm* — Dentons US LLP

(57) ABSTRACT

The present specification relates to an organic light emitting device and a lighting apparatus comprising the same. An organic light emitting device according to an exemplary embodiment of the present specification is an organic light emitting device comprising a first electrode, a second electrode, and one or more organic material layers provided between the first electrode and the second electrode, and is characterized in that at least one layer of the organic material layers is a light emission layer comprising a first light emission material and a second light emission material, and a maximum light emission peak wavelength λmax of the second light emission material has a gap of 40 to 80 nm compared to a maximum light emission peak wavelength λmax of the first light emission material.

22 Claims, 3 Drawing Sheets

(56) References Cited

U.S. PATENT DOCUMENTS

| | | | |
|---|---|---|---|
| 9,105,857 B2* | 8/2015 | Kubota | H01L 51/5044 |
| 9,577,221 B2* | 2/2017 | Weaver | H01L 27/3209 |
| 2005/0100760 A1 | 5/2005 | Yokoyama | |
| 2005/0208327 A1 | 9/2005 | Begley et al. | |
| 2006/0066209 A1 | 3/2006 | Chau | |
| 2009/0230844 A1 | 9/2009 | Pfeiffer et al. | |
| 2010/0078629 A1* | 4/2010 | Yokoyama | H01L 51/5036 257/40 |
| 2011/0084601 A1* | 4/2011 | Nakayama | C09K 11/06 313/504 |
| 2011/0227476 A1* | 9/2011 | Zhang | B32B 18/00 313/503 |
| 2011/0260114 A1 | 10/2011 | Wu et al. | |
| 2011/0291082 A1 | 12/2011 | Terao et al. | |
| 2012/0298968 A1 | 11/2012 | Kim et al. | |

FOREIGN PATENT DOCUMENTS

| | | |
|---|---|---|
| EP | 1670083 A2 | 6/2006 |
| EP | 2145354 A1 | 1/2010 |
| JP | 2008-112976 A | 5/2008 |
| JP | 2011-192829 A | 9/2011 |
| JP | 2012-89513 A | 5/2012 |
| JP | 2013-70086 A | 4/2013 |
| KR | 10-2010-0137729 A | 12/2010 |
| KR | 10-1059119 B1 | 8/2011 |
| KR | 10-2012-0077301 A | 7/2012 |
| KR | 10-2012-0113722 A | 10/2012 |
| KR | 10-2012-0130516 A | 12/2012 |
| TW | 200527956 A | 8/2005 |
| TW | 200604315 A | 2/2006 |
| TW | 201119493 A | 6/2011 |
| WO | 2008/140675 A1 | 11/2008 |

OTHER PUBLICATIONS

H.P. Lin et al.: "A simple method of fabricating efficient blue organic light-emitting diodes based on a double-dopant and a double-emissive layer with an effective hole-trapping architecture", Journal of Optoelectronics and Advanced Materials, vol. 12, No. 12, Dec. 2010, pp. 2355-2362.

Lee, et al.: "White-light-emitting diodes using miscible polymer blend doped with phosphorescent dye", XP028857093, Organic Electronics, Elsevier, vol. 12, No. 6, Mar. 2011, pp. 891-896.

\* cited by examiner

LIGHT EMISSON MECHANISM

ORGANIC LIGHT EMITTING DEVICE AND LIGHTING APPARATUS COMPRISING THE SAME

TECHNICAL FIELD

This application is a National Stage Entry of International Application No. PCT/KR2015/000251, filed on Jan. 9, 2015, and claims the benefit of and priority to Korean Application No. 10-2014-0003503, filed on Jan. 10, 2014, all of which are hereby incorporated by reference in their entirety for all purposes as if fully set forth herein.

The present specification relates to an organic light emitting device and a lighting apparatus comprising the same.

BACKGROUND ART

Lighting using an organic light emitting device may have a spectral power distribution (SPD) similar to that of a standard light source in order to achieve a high color rendering index. The lighting using the organic light emitting device in the related art, light emission materials of red (R), green (G), and blue (B) are generally used, but light emission is relatively low between light emission peaks of green (G) and blue (B), so that there is a limit in that a color rendering index (CRI) is low.

In order to supplement the aforementioned limit, there has been an attempt to introduce a method of decreasing an area in which light emission is weak, by increasing a width of a peak of green (G) light emission by adjusting a cavity of green (G) light emission or increasing a concentration of a light emission dopant, but there is still a limit in obtaining the CRI of 90% or more, a decrease in power efficiency is accompanied, and there is a problem in that it is two inconvenient to configure products having different cavities while manufacturing.

DETAILED DESCRIPTION OF THE INVENTION

Technical Problem

The present specification describes an organic light emitting device, which is capable of providing white illumination with improved color rendering index (CRI) characteristics, and a lighting apparatus comprising the same.

Technical Solution

An exemplary embodiment of the present specification provides an organic light emitting device comprising: a first electrode; a second electrode; and one or more organic material layers provided between the first electrode and the second electrode, in which at least one layer of the organic material layers is a light emission layer comprising a first light emission material and a second light emission material, and a maximum light emission peak wavelength λmax of the second light emission material has a gap of 40 to 80 nm compared to a maximum light emission peak wavelength λmax of the first light emission material.

An organic light emitting device according to another exemplary embodiment of the present specification further comprises an additional light emission layer in addition to the light emission layer comprising the first light emission material and the second light emission material.

In another exemplary embodiment of the present specification, the organic light emitting device is a white organic light emitting device.

Another exemplary embodiment of the present specification provides a lighting apparatus comprising the organic light emitting device or the white organic light emitting device.

Advantageous Effects

According to the exemplary embodiment of the present specification, it is possible to implement a light emission wavelength similar to a SPD of a standard light source by using a blue light emission material together with a bluish green light emission material, thereby improving a color rendering index (CRI). Further, the blue light emission material and the bluish green light emission material may be used together as described above, so that it may be expected to implement an intended light emission wavelength and improve efficiency and/or a lifespan of a device according to a selection of a light emission material, compared to a case where a single light emission material is used.

BEST MODE

Figure 1:
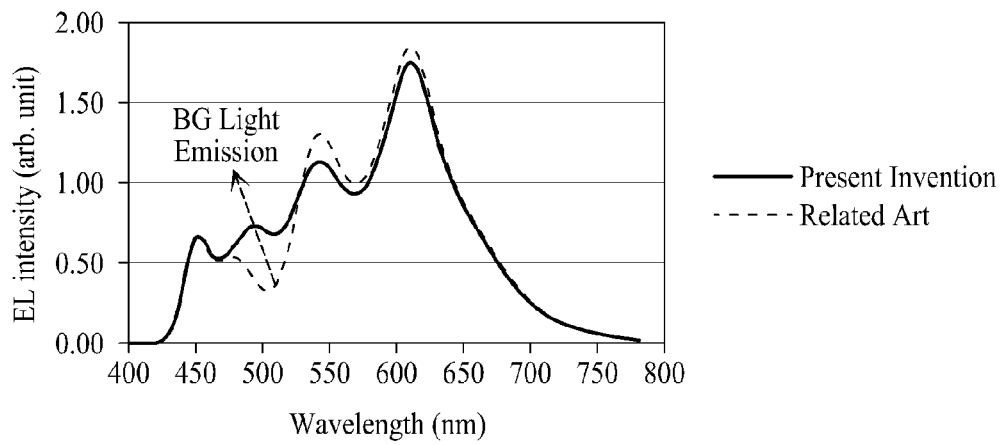
FIG. 1 illustrates a comparison of light emitting wavelengths implementable by a white organic light emitting device comprising a blue light emission material, a green light emission material, and a red light emission material in the related art, and a white organic light emitting device using a blue light emission material, a bluish green light emission material, a green light emission material, and a red light emission material together according to an exemplary embodiment of the present specification.

Hereinafter, the present invention will be described in detail.

An exemplary embodiment of the present specification is an organic light emitting device comprising a first electrode, a second electrode, and one or more organic material layers provided between the first electrode and the second electrode, and is characterized in that at least one layer of the organic material layers is a light emission layer comprising a first light emission material and a second light emission material, and a maximum light emission peak wavelength λmax of the second light emission material has a gap of 40 to 80 nm compared to a maximum light emission peak wavelength λmax of the first light emission material.

According to the exemplary embodiment of the present specification, the first light emission material may be a blue light emission material, and the second light emission material may be a bluish green light emission material.

According to the exemplary embodiment of the present specification, the light emission layer comprising the bluish green light emission material together with the blue light emission material is formed. In this case, bluish green color light is emitted by receiving blue energy, so that another layer needs not to be stacked, thereby simplifying a process. That is, it is not necessary to use two layers of green and bluish green in order to increase a color rendering index (CRI). Further, a lifespan of the bluish green light emission material is longer than a lifespan of the blue light emission material, thereby being helpful to improve a lifespan. Further, when a fluorescent material is used for both the blue light emission material and the bluish green light emission material, all of fluorescent blue light and bluish green light have large energy, so that when the light emission layer of each color is stacked, an increase in a voltage is large and efficiency obtainable compared to the increase in the voltage is not high.

In the present specification, color rendition is caused by a characteristic of a light source among the three elements of color, that is, a color sample (object), a light source, and eyes, and means a phenomenon in which the same color sample looks with different colors according to a characteristic of a light source. A phenomenon that a color of a suit, which looks beautiful outdoors, looks weak under a fluorescent lamp is an example of the color rendition phenomenon which people may easily encounter. Particularly, even though a fluorescent lamp has a similar color temperature to that of daylight, a spectral distribution of the fluorescent lamp has a very different aspect from that of daylight. Accordingly, the color rendition of the light source is evaluated based on a spectral distribution of daylight and a planckian radiator.

Another exemplary embodiment of the present specification provides a white organic light emitting device comprising a first electrode, a second electrode, and one or more organic material layers provided between the first electrode and the second electrode, in which one or more of a blue light emission material, a bluish green light emission material, a red light emission material, a green light emission material, and a yellow light emission material is comprised between the first electrode and the second electrode. For example, the white organic light emitting device comprises: a blue light emission material, a bluish green light emission material, a blue light emission material, and a red light emission material; a blue light emission material, a bluish green light emission material, a yellow light emission material, and a red light emission material; or a blue light emission material, a bluish green light emission material, a green light emission material, a yellow light emission material, and a red light emission material.

In the exemplary embodiment of the present specification, a maximum light emission wavelength of the green light emission material is about 545 nm, a maximum light emission wavelength of the yellow light emission material is about 560 nm, and a maximum light emission wavelength of the red light emission material is about 610 nm.

FIG. 1 illustrates a comparison of light emitting wavelengths implementable by a white organic light emitting device comprising a blue light emission material, a green light emission material, and a red light emission material in the related art, and a white organic light emitting device using a blue light emission material, a bluish green light emission material, a green light emission material, and a red light emission material together according to an exemplary embodiment of the present specification. According to FIG. 1, the organic light emitting device according to the related art has weak light emission at a frequency of around 500 nm between blue and green, so that there is a limit in improving a level of a CRI, but when a blue light emission material and a bluish green light emission material are used together according to the exemplary embodiment of the present specification, light emission at a frequency of around 500 nm is supplemented, so that it is possible to implement a level similar to that of a spectral power distribution (SPD) of a standard light source.

Particularly, according to the exemplary embodiment of the present specification, the organic light emitting device may exhibit a more excellent effect when a maximum light emission peak wavelength λmax of the second light emission material has a gap of 40 to 80 nm compared to a maximum light emission peak wavelength λmax of the first light emission material.

According to the exemplary embodiment of the present specification, the bluish green light emission material is a light emission material having a maximum light emission peak wavelength λmax of more than 500 nm and equal to or lower than 550 nm.

According to the exemplary embodiment of the present specification, the bluish green light emission material is a light emission material having a maximum light emission peak wavelength λmax which is equal to or larger than 505 nm and equal to or lower than 530 nm.

According to the exemplary embodiment of the present specification, the bluish green light emission material is a light emission material having a maximum light emission peak wavelength λmax of 515 nm.

As a result of an experiment conducted by the present inventors, when the bluish green light emission material having the aforementioned value of the maximum light emission peak wavelength is mixed with the blue light emission material for use, there was obtained an excellent result in that a blue shift is generated at a light emission wavelength of the bluish green light emission material, so as to fill light having a wavelength of 500 nm. When overlapping of a light emission wavelength of the bluish green light emission material and a light emission wavelength of the blue light emission material is large, light emission energy of the blue light emission material is lost to the bluish green light emission material. Accordingly, when a maximum light emission peak wavelength of the bluish green light emission material is too small, light emission of blue is too rapidly decreased, so that there may be a problem in actually implementing a device.

According to the exemplary embodiment of the present specification, the light emission layer comprises a light emission host and a light emission dopant. In this case, the light emission dopant may comprise the first light emission material and the second light emission material. Further, the first light emission material may be a blue light emission dopant, and the second light emission material may be a bluish green light emission dopant. The light emission host is a material helping the light emission dopant in emitting light by transmitting excitation energy, which is formed by combining holes and electrons received from the first electrode and the second electrodes, respectively, to the light emission dopant.

According to the exemplary embodiment of the present specification, the light emission layer comprises a fluorescent light emission host and a fluorescent light emission dopant. In this case, the fluorescent light emission dopant may comprise the first light emission material and the second light emission material. Further, the first light emission material may be a blue light emission dopant and the second light emission material may be a bluish green light emission dopant.

Figure 2:
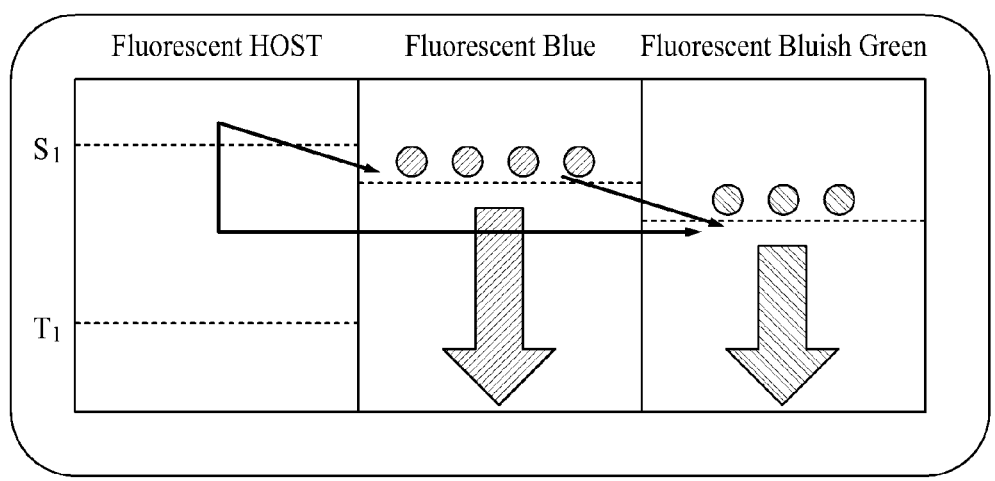
FIG. 2 illustrates a light emission mechanism in a light emission layer comprising a fluorescent host, a fluorescent blue dopant, and a fluorescent bluish green dopant.

For example, the blue light emission dopant is a material which is excited by receiving excitation energy from the light emission host, and emits blue light while being shifted from an excited state to a ground state. The bluish green light emission dopant is a material which is excited by receiving excitation energy from the light emission host and/or the blue light emission dopant, and emits bluish green light while being shifted from an excited state to a ground state. According to one example, as illustrated in FIG. 2, a level of S1 of the bluish green light emission dopant is lower than a level of S1 of the blue light emission dopant, and the level of S1 of the blue light emission dopant is lower than level of S1 of the light emission host. In FIG. 2, S1 is an excitation level at which a fluorescent material has a light emission spectrum, and T1 is an excitation level at which a phosphorescent material has a light emission spectrum.

According to the exemplary embodiment of the present specification, in the light emission layer comprising the light emission host, the blue light emission dopant, and the bluish green light emission dopant, a concentration of the bluish green light emission dopant is lower than a doping concentration of the blue light emission dopant. As described above, it is possible to minimize a decrease in intensity of the blue light emission by the blue light emission dopant by making a content of the bluish green light emission dopant be lower than a content of the blue light emission dopant. More particularly, as illustrated in FIG. 2, energy may be shifted from the blue light emission dopant to the bluish green light emission dopant similar to the shift of the energy from the light emission host to the blue light emission dopant, so that it is possible to reduce a decrease in intensity of light emission by the blue light emission dopant by making a doping concentration of the bluish green light emission dopant be lower than a doping concentration of the blue light emission dopant.

According to one particular example, in the light emission layer comprising the light emission host, the blue light emission dopant and the bluish green light emission dopant, a content of the blue light emission dopant is 2 to 10 weight %, and a content of the bluish green light emission dopant is less than 1 weight %. The content of the bluish green light emission dopant may be from 0.01 weight % to less than 1 weight %. The content of the bluish green light emission dopant may be 0.01 weight % to 5 weight %.

According to the exemplary embodiment of the present specification, energy may be transferred from the blue light emission dopant having high energy to the bluish green light emission dopant by co-depositing the blue light emission dopant and the bluish green light emission dopant on the fluorescent light emission layer of the organic light emitting device. In this case, it is important to improve a CRI by making light be generated in a region in which light emission is very weak in the related art through minimizing a decrease in intensity of blue light and light emission of bluish green. Accordingly, when a difference between the maximum light emission peak wavelength λmax of the blue light emission dopant and the maximum light emission peak wavelength λmax of the bluish green light emission dopant is small, essentially required light emission of blue becomes very small, so that light of bluish green is greatly emitted. As described above, when the difference between the maximum light emission peak wavelength λmax of the blue light emission dopant and the maximum light emission peak wavelength λmax of the bluish green light emission dopant is small, for example, when the maximum light emission peak wavelength λmax of the blue light emission dopant is 500 nm, there may be a problem in that a color temperature of the organic light emitting device is considerably degraded. Further, when the small amount of bluish green light emission dopant is doped, light emission of blue is considerably decreased, so that there may be a problem in that mass-productivity is also degraded.

Accordingly, in the present application, the maximum light emission peak wavelength λmax of the second light emission material has a gap of 40 to 80 nm compared to the maximum light emission peak wavelength λmax of the first light emission material, so that a decrease in light emission of blue may be reduced and it is possible to maintain a color temperature of the organic light emitting device, and a CRI may be improved. In this case, the first light emission material may be the blue light emission dopant and the second light emission material may be the bluish green light emission dopant.

According to the exemplary embodiment of the present specification, materials known in the art may be used as the light emission host, the blue light emission dopant, and the bluish green light emission dopant, and for example, materials having energy levels below may be used.

Light emission host: HOMO 6 eV/LUMO 3 eV
Blue light emission dopant: HOMO 6 eV/LUMO 3.2 eV
Bluish light emission dopant: HOMO 5.3 eV/LUMO 2.8 eV According to the exemplary embodiment of the present specification, a thickness of the light emission layer comprising the aforementioned first light emission material and second light emission material is not particularly limited, but may be, for example, 200 to 500 Å, and for concrete example, about 300 Å. The light emission layer may be formed by vacuum thermal deposition.

The organic light emitting device according to the exemplary embodiment of the present specification further comprises one or more light emission layers in addition to the light emission layer comprising the first light emission material and the second light emission material. The number of light emission layers is not particularly limited, and the light emission layers comprising two layers, three layers, or four or more layers may be comprised.

Another exemplary embodiment of the present specification provides a white organic light emitting device comprising: a first electrode; a second electrode; a first light emission layer comprising at least one of a blue light emission material, a green light emission material, a yellow light emission material, and a red light emission material; and a second light emission layer comprising a blue light emission material and a bluish green light emission material, the first light emission layer and the second light emission layer being provided between the first electrode and the second electrode. In this case, a stack order of the first light emission layer and the second light emission layer is not limited. For example, the first light emission layer may be disposed to be closer to the first electrode than the second light emission layer, and the first light emission layer may be disposed to be closer to the second electrode than the second light emission layer. The present inventors found that when the two light emission layers are stacked as described above, a CRI is improved.

Another exemplary embodiment of the present specification provides a white organic light emitting device comprising: a first electrode; a second electrode; a first light emission layer comprising at least one of a blue light emission material, a yellow light emission material, a red light emission material; and a second light emission layer comprising a blue light emission material and a bluish green light emission material, the first light emission layer and the second light emission layer being provided between the first electrode and the second electrode.

Another exemplary embodiment of the present specification provides a white organic light emitting device comprising: a first electrode; a second electrode; a first light emission layer comprising at least one of a yellow light emission material and a red light emission material, and a green light emission material; and a second light emission layer comprising a blue light emission material and a bluish green light emission material, the first light emission layer and the second light emission layer being provided between the first electrode and the second electrode.

According to another exemplary embodiment of the present specification, the organic light emitting device is a white organic light emitting device comprising: a first light emission layer comprising a green light emission material and a red light emission material or a green light emission material and a yellow light emission material; and a second light emission layer comprising a blue light emission material and a bluish green light emission material, the first light emission layer and the second light emission layer being provided between the first electrode and the second electrode.

According to an exemplary embodiment of the present specification, the first light emission layer is a phosphorous light emission layer and the second light emission layer is a fluorescent light emission layer.

According to another exemplary embodiment of the present specification, the organic light emitting device comprises: a first electrode; a second electrode; a first light emission layer comprising at least one of a blue light emission material, a green light emission material, a yellow light emission material, and a red light emission material; a second light emission layer comprising a blue light emission material and a bluish green light emission material; and a third light emission layer comprising at least one of a blue light emission material, a green light emission material, a yellow light emission material, and a red light emission material, the first light emission layer, the second light emission layer, and the third light emission layer being provided between the first electrode and the second electrode. The present inventors found that when the three light emission layers are stacked like the exemplary embodiment, a CRI is considerably increased.

In this case, a stacking order of the first light emission layer, the second light emission layer, and the third light emission layer is not limited. For example, the light emission layers may have a structure in which the first light emission layer, the second light emission layer, and the third light emission layer are sequentially stacked on the first electrode, a structure in which the third light emission layer, the second light emission layer, and the first light emission layer are sequentially stacked on the first electrode, a structure in which the first light emission layer, the third light emission layer, and the second light emission layer are sequentially stacked on the first electrode, and a structure in which the second light emission layer, the first light emission layer, and the third light emission layer are sequentially stacked on the first electrode.

According to another exemplary embodiment of the present specification, the organic light emitting device is a white organic light emitting device comprising: a first light emission layer comprising a blue light emission material, a green light emission material and a red light emission material, or a green light emission material and a yellow light emission material; a second light emission layer comprising a blue light emission material and a bluish green light emission material; and a third light emission layer comprising a green light emission material and a red light emission material or a green light emission material and a yellow light emission material, the first light emission layer, the second light emission layer, and the third light emission layer being provided between the first electrode and the second electrode.

According to another exemplary embodiment of the present specification, the organic light emitting device is a white organic light emitting device comprising: a first light emission layer comprising a green light emission material and a red light emission material or a green light emission material and a yellow light emission material; a second light emission layer comprising a blue light emission material and a bluish green light emission material; and a third light emission layer comprising a blue light emission material, a green light emission material and a red light emission material, or a green light emission material and a yellow light emission material, the first light emission layer, the second light emission layer, and the third light emission layer being provided between the first electrode and the second electrode.

According to another exemplary embodiment of the present specification, the organic light emitting device is a white organic light emitting device comprising: a first light emission layer comprising a blue light emission material; a second light emission layer comprising a blue light emission material and a bluish green light emission material; and a third light emission layer comprising a green light emission material and a red light emission material or a green light emission material and a yellow light emission material, the first light emission layer, the second light emission layer, and the third light emission layer being provided between the first electrode and the second electrode.

According to another exemplary embodiment of the present specification, the organic light emitting device is a white organic light emitting device comprising: a first light emission layer comprising a green light emission material and a red light emission material or a green light emission material and a yellow light emission material; a second light emission layer comprising a blue light emission material and a bluish green light emission material; and a third light emission layer comprising a blue light emission material, the first light emission layer, the second light emission layer, and the third light emission layer being provided between the first electrode and the second electrode.

According to another exemplary embodiment of the present specification, the organic light emitting device is a white organic light emitting device comprising: a first light emission layer comprising a green light emission material and a red light emission material or a green light emission material and a yellow light emission material; a second light emission layer comprising a blue light emission material and a bluish green light emission material; and a third light emission layer comprising a green light emission material and a red light emission material, or a green light emission material and a yellow light emission material, the first light emission layer, the second light emission layer, and the third light emission layer being provided between the first electrode and the second electrode.

According to another exemplary embodiment of the present specification, the organic light emitting device is a white organic light emitting device comprising: a first light emission layer comprising a green light emission material and a red light emission material; a second light emission layer comprising a blue light emission material and a bluish green light emission material; and a third light emission layer comprising a green light emission material and a red light emission material, the first light emission layer, the second light emission layer, and the third light emission layer being provided between the first electrode and the second electrode.

Figure 3:
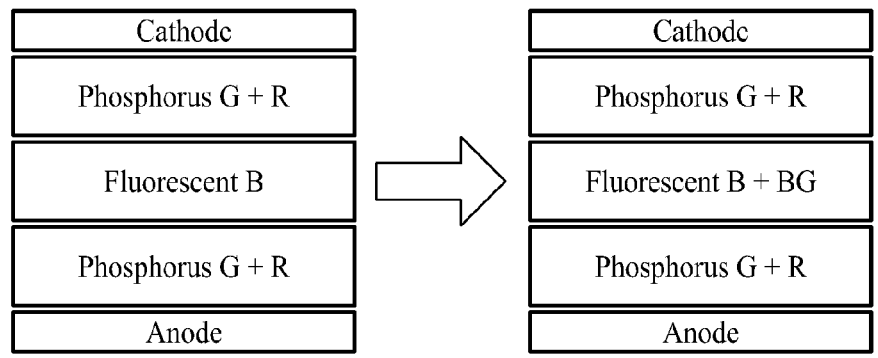
FIG. 3 illustrates an example of a stack structure of an organic light emitting device according to an exemplary embodiment of the present specification.

According to another exemplary embodiment of the present specification, the organic light emitting device is a white organic light emitting device comprising light emission layers in which a first light emission layer comprising a green light emission material and a red light emission material, a second light emission layer comprising a blue light emission material and a bluish green light emission material, and a third light emission layer comprising a green light emission material and a red light emission material are sequentially stacked, the light emission layers being provided between the first electrode and the second electrode. FIG. 3 illustrates an example of a structure in which the second light emission layer comprising only a blue light emission material is improved so as to comprise both a blue light emission material and a bluish green light emission material, in a structure in which three light emission layers are stacked.

According to another exemplary embodiment of the present invention, the first light emission layer, the second light emission layer, and the third light emission layer are sequentially stacked from the first electrode.

According to another exemplary embodiment of the present invention, the first light emission layer and the third light emission layer are phosphorous light emission layers, and the second light emission layer is a fluorescent light emission layer.

In the technical field, a green and/or red phosphorous light emission dopant is used as a material of a phosphorous light emission layer, but when a bluish green phosphorous light emission dopant is used together with the green phosphorous light emission dopant and/or the red phosphorous light emission dopant, there is a problem in that an additional layer may need to be further stacked in order to apply the bluish green phosphorous light emission dopant, and there is a problem in that the bluish green phosphorous light emission material has a short lifespan, so that mass-productivity is low. Further, there is a disadvantage in that in order to apply all of the bluish green, green, and red phosphorous light emission dopants to one phosphorous light emission layer, it is difficult to control a process. Further, when the bluish green phosphorous light emission dopant is used together with the green phosphorous light emission dopant and the red phosphorous light emission dopant, the bluish green phosphorous light emission dopant needs to be comprised with the largest concentration because an energy potential is shifted from a bluish green color to a green color, and from the green color to a red color, but it is difficult to implement such a aforementioned configuration due to the inferior lifespan characteristic as described above. Accordingly, according to the aforementioned exemplary embodiment, an organic material layer comprising the bluish green fluorescent light emission dopant together with the blue fluorescent light emission dopant is implemented.

Another exemplary embodiment of the present specification provides a lighting apparatus comprising the organic light emitting device or the white organic light emitting device.

The lighting apparatus according to the exemplary embodiment of the present specification may implement a similar level to that of the SPD of the standard light source by using an organic light emitting device using a light emission layer comprising a blue light emission material and a bluish green light emission material together. Accordingly, the lighting apparatus according to several exemplary embodiments of the present specification may reach a CRI of 90% or more, and may exceed a CRI of 92% and reach a CRI of 93% or more. The value is a value increased by 5.8% or more, preferably, 9% or more, compared to a CRI of 85% of the lighting apparatus comprising the organic light emitting device in the related art.

A spectral band method and a test color method have been introduced as a method of defining a CRI, but the Commission Internationale de l'Eclairage acknowledges performance of the test color method and recommends the test color method.

The spectral band method is a method of assigning a predetermined weighted value to a spectral distribution of a light source for each wavelength range and indicating a difference between the light source and daylight (planckian radiator). In the meantime, in the test color method, a color coordinate value under a standard light source (planckian radiator at the same temperature as a color temperature of a test light source) is compared with a color coordinate value under a test light source by the method of CIE No. 13.2 (TC-3.2) 1974, and colors of several color samples are calculated based on chrominance ($\Delta E$).

In the present specification, a value of a CRI was measured based on relative reflectivity of a standard sample of a comparative light source to solar light that is a standard light source.

Further, in the lighting apparatus according to several exemplary embodiments of the present specification, R9 may reach 40% or more. The value is a value increased by about 82% compared to R9 of 22% of the lighting apparatus comprising the organic light emitting device in the related art. R9 indicates a CRI of a standard sample corresponding to strong red among the standard samples for evaluating a CRI. When R9 is high, it means that color reproduction performance for a red color is very excellent.

Further, in the lighting apparatus according to several exemplary embodiments of the present specification, a correlated color temperature (CCT) exceeds 3,000 K.

According to an exemplary embodiment of the present specification, the organic light emitting device may further comprise an additional organic material layer between the organic material layer comprising the light emission material and the electrode, or between the organic material layers comprising the light emitting materials. The additional organic material layer may be a hole injection layer, a hole transporting layer, an electron blocking layer, an electron transporting layer, an electron injection layer, a hole blocking layer, a buffer layer, or the like. The organic material layers may use a material and a configuration which are known in the art.

According to an exemplary embodiment of the present specification, the organic light emitting device further comprises one or more light emission layers, in addition to a light emission layer comprising a blue light emission material and a bluish red light emission material, and an intermediate electrode or a charge generating layer is comprised between the light emission layers. The intermediate electrode and the charge generating layer may also be configured by a single layer, respectively, and may also have a stack structure comprising two or more layers.

The intermediate electrode may comprise one layer or two or more layers, and comprise a conductive metal, a metal oxide, or a conductive polymer usable as a material of a first electrode or a second electrode.

The charge generating layer may comprise one layer or two or more layers, and comprise a material and a structure which are known in the art. For example, the charge generating layer may have a structure in which an n-type organic material layer and a p-type organic material layer forming an NP junction with the n-type organic material layer are sequentially stacked from an anode side. An n-type doped organic material layer may be additionally comprised in the anode side of the n-type organic material layer.

According to one particular example, the organic light emitting device may be configured of anode (ITO)/HIL/HTL 1/HTL 2/phosphorous G+R/ETL/CGL/HIL/HTL1/HTL 2/fluorescent B+BG/ETL/CGL/HIL/HTL 1/HTL 2/phosphorous G+R/ETL/EIL/cathode (Al or Ag).

Any one of the first electrode and the second electrode may be the anode and the other one is a cathode. The first electrode and the second electrode may be configured by using a material and a technique which are known in the art. An auxiliary electrode may be additionally used as necessary.

The lighting apparatus may also be formed of only the aforementioned organic light emitting device, or and may additionally comprise a frame provided so as to be easily installed on a ceiling or a wall of a building or a power connection part.

MODE FOR CARRYING OUT THE INVENTION

Hereinafter, exemplary embodiments described in the present specification will be exemplified through Examples in more detail. However, the Examples below are only the purpose of illustration, and do not intend to limit the scope of the present invention.

Experimental Example

Figure 4:
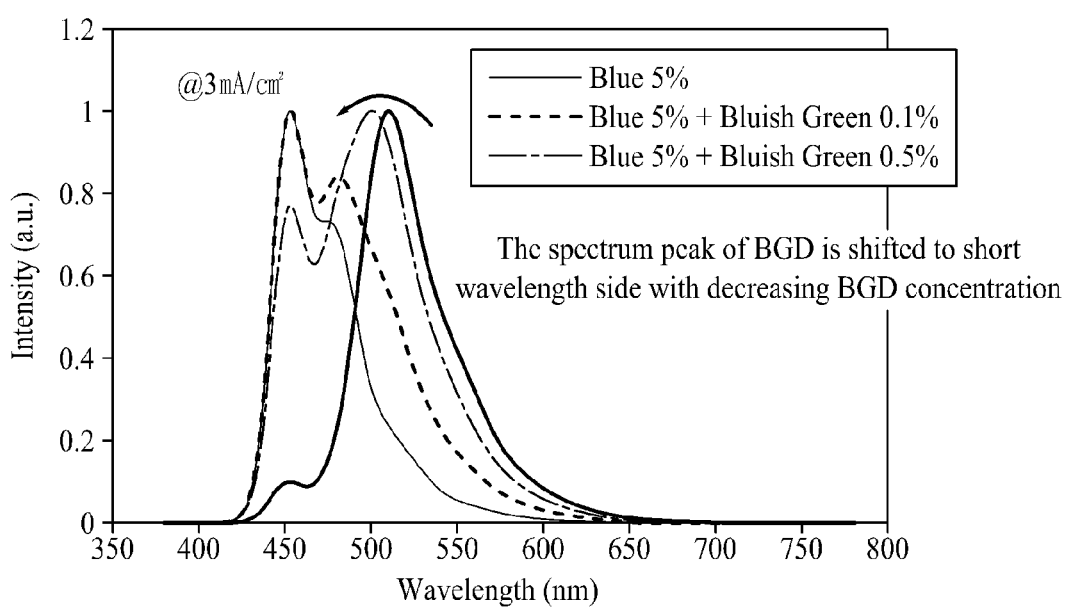
FIGS. 4 and 5 illustrate light emission wavelengths for a case where a material having λmax of 515 nm is applied as a bluish green fluorescent dopant and a case where a material having λmax of 500 nm is applied as a bluish green fluorescent dopant, in an organic light emitting device comprising a single light emission layer.
Figure 5:
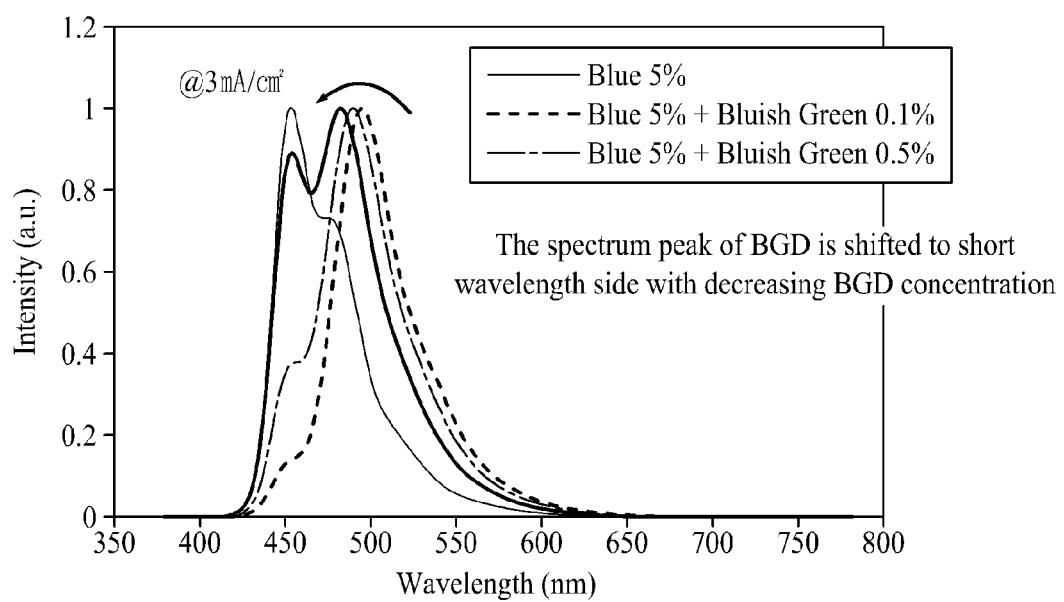

FIGS. 4 and 5 illustrate light emission wavelengths of a case where a material having λmax of 515 nm is applied as a bluish green fluorescent dopant and a case where a material having λmax of 500 nm is applied as a bluish green fluorescent dopant, when a single light emission layer comprising the blue fluorescent dopant and the bluish green fluorescent dopant is formed. Referring to FIGS. 4 and 5, it can be seen that the material having λmax of 515 nm may supplement light emission at a wavelength of 500 nm compared to the material having λmax of 500 nm by a blue shift phenomenon of a light emission wavelength of the bluish green fluorescent dopant. Further, when the material having λmax of 515 nm is used, there is a problem in that a decrease in a blue light emission peak is increased. Accordingly, it can be seen that it is preferable to apply the bluish green fluorescent dopant having a light emission wavelength of 515 nm.

Example 1

An organic light emitting device, which comprises: a first light emission layer comprising a red phosphorous dopant of 0.45 weight % and a green phosphorous dopant of 10 weight %; a second light emission layer comprising a blue fluorescent dopant of 5 weight % and a bluish green fluorescent dopant of 0.25 weight %; and a third light emission layer comprising a red phosphorous dopant of 0.45 weight % and a green phosphorous dopant of 10 weight % between an anode and a cathode, was manufactured.

Comparative Example 1

An organic light emitting device was manufactured by the same method as that of Example 1, except that when a second light emission layer was formed, a bluish green fluorescent dopant is not used, and only a blue fluorescent dopant of 5 weight % was doped.

CRI and the like of the organic light emitting devices of Example 1 and Comparative Example 1 were measured and represented in Table 1 below.

TABLE 1

|  | CRI (%) | R9 (%) | CCT |
|---|---|---|---|
| Example 1 | 94 | 63 | 3,500K |
| Comparative Example 1 | 88 | 31 | 3,500K |

As can be seen in the result, according to the exemplary embodiment of the present specification, it is possible to implement a light emission wavelength similar to a SPD of a standard light source by using a blue light emission material together with a bluish green light emission material, thereby improving a CRI. Further, the blue light emission material and the bluish green light emission material may be used together as described above, so that it may be expected to implement an intended light emission wavelength and improve efficiency and/or a lifespan of a device according to a selection of a light emission material, compared to a case where a single light emission material is used.

The invention claimed is:
1. An organic light emitting device comprising:
a first electrode;
a second electrode; and
one or more organic material layers provided between the first electrode and the second electrode,
wherein at least one layer of the organic material layers is a light emission layer comprising a first light emission material and a second light emission material, and
a maximum light emission peak wavelength λmax of the second light emission material has a gap of 40 to 80 nm compared to a maximum light emission peak wavelength λmax of the first light emission material,
wherein the light emission layer comprises a light emission host and a light emission dopant, and the light emission dopant comprises the first light emission material and the second light emission material.
2. The organic light emitting device of claim 1, wherein the maximum light emission peak wavelength λmax of the second light emission material is 505 nm or more and 530 nm or less.
3. The organic light emitting device of claim 1, wherein the maximum light emission peak wavelength λmax of the second light emission material is 515 nm.
4. The organic light emitting device of claim 1, wherein the light emission layer comprises a fluorescent light emission host and a fluorescent light emission dopant, and
the fluorescent light emission dopant comprises the first light emission material and the second light emission material.
5. The organic light emitting device of claim 1, wherein a concentration of the second light emission dopant is lower than a doping concentration of the first light emission material.

6. The organic light emitting device of claim 5, wherein a content of the first light emission material within the light emission layer is 2 to 10 weight %, and a content of the second light emission material within the light emission layer is less than 1 weight %.

7. The organic light emitting device of claim 1, wherein the light emission layer further comprises one or more of a red light emission material, a green light emission material, and a yellow light emission material.

8. The organic light emitting device of claim 1, further comprising:
one or more light emission layers in addition to the light emission layer comprising the first light emission material and the second light emission material.

9. The organic light emitting device of claim 8, further comprising:
an intermediate electrode or a charge generating layer provided between the light emission layers.

10. The organic light emitting device of claim 1, wherein a color rendering index (CRI) of the organic light emitting device is 90% or more.

11. The organic light emitting device of claim 1, wherein R9 of the organic light emitting device is 40% or more.

12. The organic light emitting device of claim 1, wherein a correlated color temperature (CCT) of the organic light emitting device exceeds 3,000 K.

13. The organic light emitting device of claim 1, wherein the organic light emitting device is a white organic light emitting device.

14. A lighting apparatus comprising the organic light emitting device of claim 1.

15. An organic light emitting device comprising:
a first electrode;
a second electrode; and
one or more organic material layers provided between the first electrode and the second electrode,
wherein at least one layer of the organic material layers is a light emission layer comprising a first light emission material and a second light emission material, and
a maximum light emission peak wavelength λmax of the second light emission material has a gap of 40 to 80 nm compared to a maximum light emission peak wavelength λmax of the first light emission material, and
wherein the first light emission material is a blue light emission material, and the second light emission material is a bluish green light emission material.

16. The organic light emitting device of claim 15, wherein the light emission layer comprises: the first light emission material, the second light emission material, a red light emission material, and a green light emission material; the first light emission material, the second light emission material, a red light emission material, and a yellow light emission material; or the first light emission material, the second light emission material, a red light emission material, a green light emission material, and a yellow light emission material.

17. The organic light emitting device of claim 15, comprising:
a first light emission layer and a second light emission layer between the first electrode and the second electrode,
wherein the first light emission layer comprises at least one of the first light emission material, a green light emission material, a yellow light emission material, and a red light emission material, and
the second light emission layer comprises the first light emission material and the second light emission material.

18. The organic light emitting device of claim 17, wherein the first light emission layer is a phosphorous light emission layer, and the second light emission layer is a fluorescent light emission layer.

19. The organic light emitting device of claim 15, comprising:
a first light emission layer and a second light emission layer between the first electrode and the second electrode,
wherein the first light emission layer comprises a green light emission material and a red light emission material, or a green light emission material and a yellow light emission material, and
the second light emission layer comprises the first light emission material and the second light emission material.

20. The organic light emitting device of claim 15, comprising:
a first light emission layer, a second light emission layer, and a third light emission layer between the first electrode and the second electrode,
wherein the first light emission layer comprises at least one of the first light emission material, a green light emission material, a yellow light emission material, and a red light emission material,
the second light emission layer comprises the first light emission material and the second light emission material, and
the third light emission layer comprises at least one of the first light emission material, a green light emission material, a yellow light emission material, and a red light emission material.

21. The organic light emitting device of claim 20, wherein the first light emission layer and the third light emission layer are phosphorous light emission layers, and the second light emission layer is a fluorescent light emission layer.

22. The organic light emitting device of claim 15, comprising:
a first light emission layer, a second light emission layer, and a third light emission layer between the first electrode and the second electrode,
wherein the first light emission layer comprises the first light emission material, a green light emission material and a red light emission material, or a green light emission material and a yellow light emission material,
the second light emission layer comprises the first light emission material and the second light emission material, and
the third light emission layer comprises a green light emission material and a red light emission material, or a green light emission material and a yellow light emission material.

* * * * *